United States Patent
Hsu et al.

(10) Patent No.: US 10,242,927 B2
(45) Date of Patent: Mar. 26, 2019

(54) SEMICONDUCTOR PACKAGE, SEMICONDUCTOR DEVICE USING THE SAME AND MANUFACTURING METHOD THEREOF

(71) Applicant: MEDIATEK Inc., Hsin-Chu (TW)

(72) Inventors: Wen-Sung Hsu, Zhubei (TW); Shih-Chin Lin, Taoyuan (TW); Ming-Jen Hsiung, Zhubei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/342,138

(22) Filed: Nov. 3, 2016

(65) Prior Publication Data

US 2017/0194227 A1 Jul. 6, 2017

Related U.S. Application Data

(60) Provisional application No. 62/273,478, filed on Dec. 31, 2015.

(51) Int. Cl.

| | |
|---|---|
| *H01L 23/31* | (2006.01) |
| *H01L 25/065* | (2006.01) |
| *H01L 21/56* | (2006.01) |
| *H01L 21/304* | (2006.01) |

(Continued)

(52) U.S. Cl.
CPC ........ *H01L 23/3128* (2013.01); *H01L 21/304* (2013.01); *H01L 21/56* (2013.01); *H01L 21/78* (2013.01); *H01L 23/3135* (2013.01); *H01L 23/49822* (2013.01); *H01L 23/49827* (2013.01); *H01L 23/49838* (2013.01); *H01L 23/562* (2013.01); *H01L 24/94* (2013.01); *H01L 25/0657* (2013.01); *H01L 24/13* (2013.01); *H01L 24/16* (2013.01); *H01L 24/48* (2013.01); *H01L 2224/131* (2013.01);

(Continued)

(58) Field of Classification Search
USPC ............... 257/778, E21.499, 737, E23.069, 257/E23.023, E21.511, E21.503, E25.013, 257/E23.02, E23.116, E33.056, 659, 686, 257/738, 782, E21.502, E23.04, 433; 438/83, 98, 100
See application file for complete search history.

(56) References Cited

U.S. PATENT DOCUMENTS

| | | | |
|---|---|---|---|
| 6,225,703 B1 | 5/2001 | Umehara et al. | |
| 2004/0201096 A1* | 10/2004 | Iijima ................. | H01L 21/4853 257/734 |

(Continued)

FOREIGN PATENT DOCUMENTS

| | | |
|---|---|---|
| CN | 103201833 A | 7/2013 |
| JP | 2000031343 A | 1/2000 |
| JP | 2009188392 A | 8/2009 |

OTHER PUBLICATIONS

EP Search Report dated Jun. 1, 2017 in EP application (No. 113109P792EP).

*Primary Examiner* — Niki H Nguyen
(74) *Attorney, Agent, or Firm* — Wolf, Greenfield & Sacks, P.C.

(57) ABSTRACT

A semiconductor package includes a substrate, a first electronic component, a film and a package body. The first electronic component is disposed on the substrate and has an upper surface. The film is disposed on the upper surface of the first electronic component. The package body encapsulates the first electronic component and the film.

12 Claims, 5 Drawing Sheets

(51) Int. Cl.
*H01L 21/78* (2006.01)
*H01L 23/498* (2006.01)
*H01L 23/00* (2006.01)

(52) U.S. Cl.
CPC ............ *H01L 2224/16227* (2013.01); *H01L 2224/16235* (2013.01); *H01L 2224/48229* (2013.01); *H01L 2224/73153* (2013.01); *H01L 2224/94* (2013.01); *H01L 2225/06517* (2013.01); *H01L 2225/06548* (2013.01); *H01L 2225/1023* (2013.01); *H01L 2225/1058* (2013.01); *H01L 2924/00014* (2013.01); *H01L 2924/1436* (2013.01); *H01L 2924/1533* (2013.01); *H01L 2924/15311* (2013.01); *H01L 2924/15321* (2013.01); *H01L 2924/15331* (2013.01); *H01L 2924/1815* (2013.01); *H01L 2924/19041* (2013.01); *H01L 2924/19042* (2013.01); *H01L 2924/19043* (2013.01); *H01L 2924/19105* (2013.01); *H01L 2924/3512* (2013.01)

(56) References Cited

U.S. PATENT DOCUMENTS

| | | | |
|---|---|---|---|
| 2005/0118748 A1* | 6/2005 | Sambasivam | H01L 21/563 438/106 |
| 2011/0298137 A1* | 12/2011 | Pagaila | H01L 21/561 257/773 |
| 2011/0309505 A1* | 12/2011 | Takemura | H01L 22/32 257/738 |
| 2012/0104606 A1* | 5/2012 | Okuda | H01L 21/565 257/738 |
| 2012/0112336 A1 | 5/2012 | Guzek et al. | |
| 2012/0187568 A1* | 7/2012 | Lin | H01L 21/76898 257/774 |
| 2012/0211885 A1* | 8/2012 | Choi | H01L 23/3128 257/737 |
| 2013/0307163 A1 | 11/2013 | Inoue et al. | |
| 2014/0027906 A1* | 1/2014 | Narita | H01L 23/00 257/738 |
| 2014/0322647 A1* | 10/2014 | Knapp | G03F 7/0757 430/270.1 |
| 2014/0327155 A1* | 11/2014 | Kang | H01L 23/3135 257/777 |
| 2014/0361441 A1* | 12/2014 | Bae | H01L 25/18 257/777 |
| 2015/0262708 A1* | 9/2015 | Lee | H01L 25/18 365/191 |
| 2016/0064358 A1* | 3/2016 | Usami | H01L 25/0657 257/737 |
| 2016/0079206 A1* | 3/2016 | Cho | H01L 25/0657 257/737 |

* cited by examiner

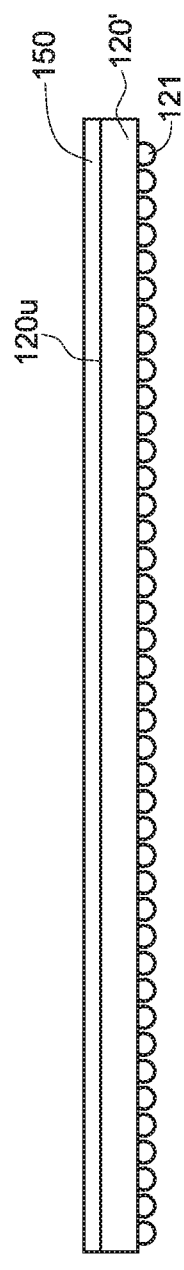
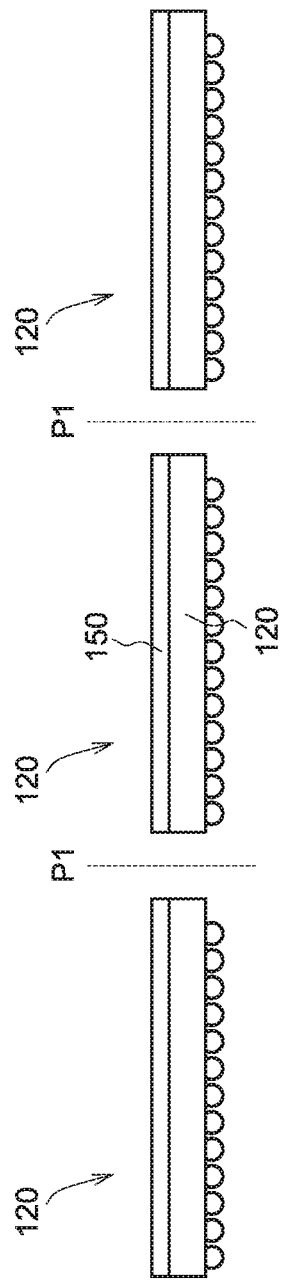

SEMICONDUCTOR PACKAGE, SEMICONDUCTOR DEVICE USING THE SAME AND MANUFACTURING METHOD THEREOF

This application claims the benefit of U.S. Provisional application Ser. No. 62/273,478, filed Dec. 31, 2015, the disclosure of which is incorporated by reference herein in its entirety.

FIELD OF THE INVENTION

The invention relates to a semiconductor package, a semiconductor device using the same and a manufacturing method thereof, and more particularly to a semiconductor package having a film, a semiconductor device using the same and a manufacturing method thereof.

BACKGROUND OF THE INVENTION

In the electronics industry, high integration and multiple functions with high performance become essential for new products. And meanwhile, high integration may cause higher manufacturing cost, since the manufacturing cost is in proportional to its size. Therefore, demanding on miniaturization of integrated circuit (IC) packages has become more and more critical. Package-on-package (PoP) is now the fastest growing semiconductor package technology since it is a cost-effective solution to high-density system integration in a single package. However, since the PoP structure has a thin thickness, the PoP structure is easy to crack or damage due to heating or other factors.

Therefore, it is important to solve or improve the above problem.

SUMMARY OF THE INVENTION

In one embodiment of the invention, a semiconductor package is provided. The semiconductor package includes a substrate, a first electronic component, a film and a package body. The first electronic component is disposed on the substrate and has an upper surface. The film is disposed on the upper surface of the first electronic component. The package body encapsulates the first electronic component and the film.

In another embodiment of the invention, a semiconductor device is provided. The semiconductor device includes a semiconductor package and a second electronic component. The semiconductor package includes a substrate, a first electronic component, a film and a package body. The first electronic component is disposed on the substrate and has an upper surface. The film is disposed on the upper surface of the first electronic component. The package body encapsulates the first electronic component and the film. The second electronic component is stacked to the semiconductor package.

In another embodiment of the invention, a manufacturing method of a semiconductor package is provided. The manufacturing method includes the following steps. A wafer having an upper surface is provided; a film is disposed on the upper surface of the wafer; a singulation path passing through the wafer and the film is formed to form at least one first electronic component on which the film is disposed; a substrate is provided; first electronic component is disposed on the substrate; and a package body encapsulating the first electronic component and the film is formed.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which:

FIG. 3 illustrates a diagram of a semiconductor device according to an embodiment of the invention; and FIGS. 4A to 4G illustrate manufacturing processes of the semiconductor package 100 of FIG. 1.

DETAILED DESCRIPTION OF PREFERRED EMBODIMENTS

Figure 1:
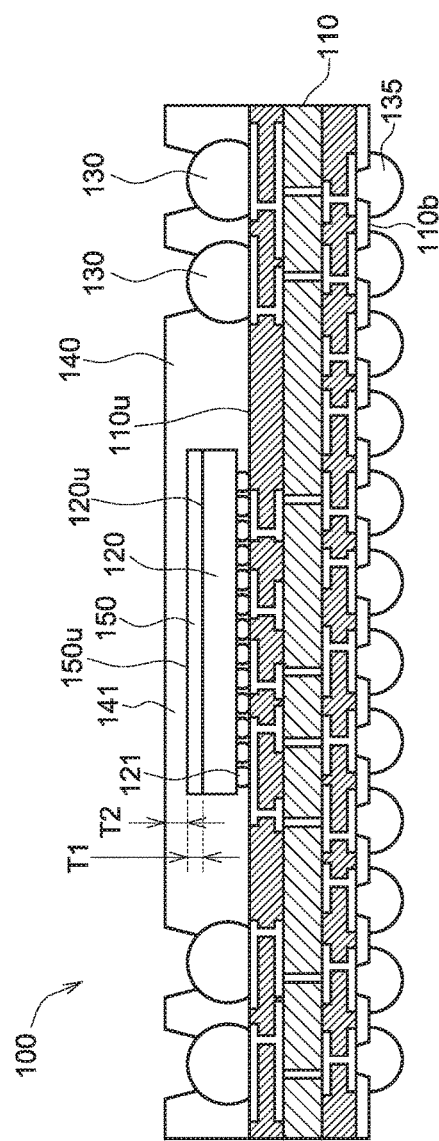
FIG. 1 illustrates a diagram of a semiconductor package according to an embodiment of the invention.

FIG. 1 illustrates a diagram of a semiconductor package 100 according to an embodiment of the invention. The semiconductor package 100 includes a substrate 110, at least one first electronic component 120, at least one first conductive contact 130, at least one second conductive contact 135, a package body 140 and a film 150.

The substrate 110 is, for example, a multi-layered structure or single-layered structure. The substrate 110 may be an organic substrate, a ceramic substrate, a silicon substrate, a metal substrate, etc. In another embodiment, the substrate 110 may be an interposer or a wafer having at least one redistribution layer (RDL).

The first electronic component 120 is disposed on the substrate 110 and has an upper surface 120u. In the present embodiment, the first electronic component 120 is coupled to an upper surface 110u of the substrate 110 in a "face-down" orientation and electrically connected to the substrate 110 via a plurality of conductive contacts 121. This configuration is sometimes referred to as "flip-chip". The conductive contact 121 may be a solder ball, a conductive pillar, etc.

In other embodiments, the first electronic component 120 may be coupled to the substrate 110 in a "face-up" orientation, and electrically connected to the substrate 110 via a plurality of conductive bond wires (not shown). The first electronic component 120 may be an active chip or a passive component, such as a resistor, an inductor or a capacitor. In another embodiment, the number of the first electronic component 120 may be several.

The first conductive contacts 130 are disposed on the upper surface 110u of the substrate 110 and surround the first electronic component 120. The first conductive contacts 130 are exposed from the package body 140 for being electrically connected to an exterior electronic component (not illustrated). For example, a portion of each first conductive contact 130 is encapsulated by the package body 140 and another portion of each first conductive contact 130 is exposed from the package body 140 for being electrically connected to the exterior electronic component. In addition, the first conductive contacts 130 may be solder balls, conductive pillars, etc.

The second conductive contacts 135 are disposed on a lower surface 110b of the substrate 110. The semiconductor package 100 may be disposed on and electrically connected to an exterior circuit, such as a circuit board, through the second conductive contacts 135. The second conductive contacts 135 may be solder balls, conductive pillars, etc.

The package body 140 encapsulates the first electronic component 120, the film 150 and a portion of each first conductive contact 130. In the present embodiment, the package body 140 covers an upper surface 150u of the film 150. In another embodiment, the package body 140 may expose the upper surface 150u of the film 150 and covers a lateral surface of the film 150.

The package body 140 includes a covering portion 141 covering the upper surface 150u of the film 150. The film 150 has a first thickness T1 being equal to or less than a second thickness T2 of the covering portion 141. As a result, it can increase the strength of the package body 140 to prevent the package body 140 from cracking in the interface between the first electronic component 120 and the package body 140.

The package body 140 may be made of the same material. For example, the package body 140 is a molding compound which is made of a material including, for example, a Novolac-based resin, an epoxy-based resin, a silicone-based resin, or another suitable encapsulant. Suitable fillers also can be included, such as powdered SiO2.

The film 150 is disposed on the upper surface 120u of the first electronic component 120. The film 150 can increase the strength of the interface between the first electronic component 120 and the package body 140 and accordingly it can prevent the package body 140 from cracking in interface between the first electronic component 120 and the package body 140. In addition, the film 150 has an adhesion conducive to fixing the package body 140 to the first electronic component 120, and accordingly it can increase the adhesion between the film 150 and the package body 140 and the adhesion between the film 150 and the first electronic component 120. In addition, the film 150 may be made of epoxy resin, acrylate resin or combination thereof.

In the present embodiment, the film 150 is directly adhered to the upper surface 120u of the first electronic component 120. In another embodiment, the film 150 may be indirectly adhered to the upper surface 120u of the first electronic component 120 by any layer structure, such as an adhesion.

Figure 2:
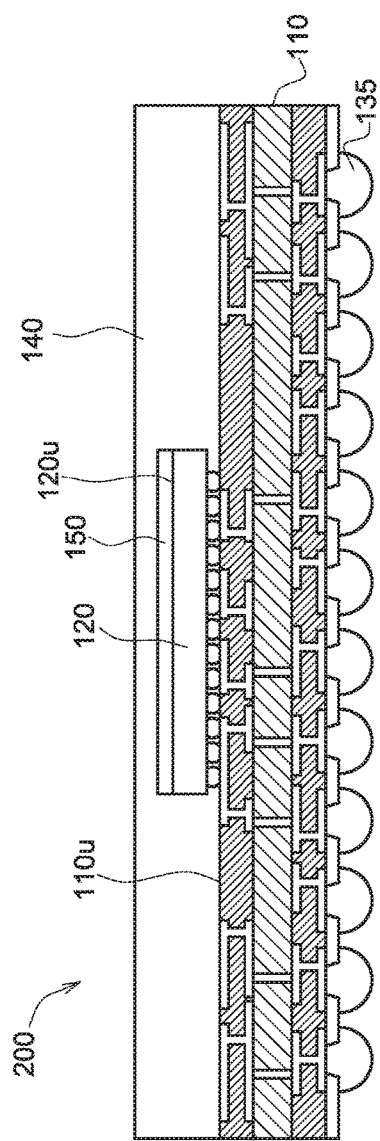
FIG. 2 illustrates a diagram of a semiconductor package according to another embodiment of the invention.

FIG. 2 illustrates a diagram of a semiconductor package 200 according to another embodiment of the invention. The semiconductor package 200 includes the substrate 110, at least one first electronic component 120, at least one second conductive contact 135, the package body 140 and the film 150. Compared to the semiconductor package 100, the semiconductor package 200 may omit the first conductive contacts 130.

Figures 3, 4A:
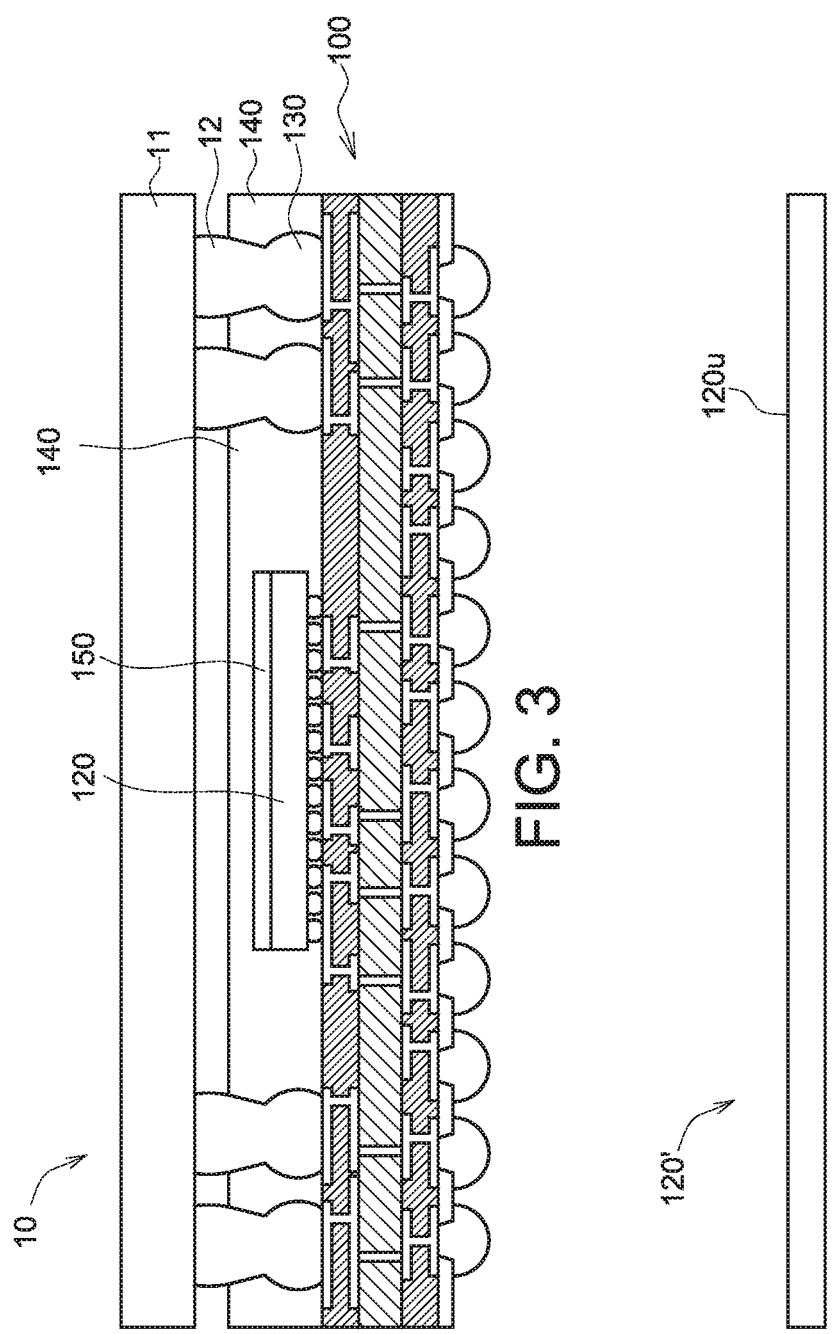

FIG. 3 illustrates a diagram of a semiconductor device 10 according to an embodiment of the invention. The semiconductor device 10 includes the semiconductor package 100 and at least one second electronic component 11.

The second electronic component 11 may be, for example, a memory, a semiconductor component rather than memory, another semiconductor package, an active component, a passive component, etc. In another embodiment, the second electronic component 11 may be a semiconductor package including a plurality of dies, such as DRAMs stacked to each other.

The second electronic component 11 is stacked to the package body 140 of the semiconductor package 100 in a "face-down" orientation or in a "face-up" orientation. The second electronic component 11 is electrically connected to the first conductive contacts 130 of the semiconductor package 100 via a plurality of conductive contacts 12, such that second electronic component 11 may be electrically to the first electronic component 120 through the conductive contacts 12, the first conductive contacts 130 and the substrate 110. This configuration is sometimes referred to as "flip-chip". The conductive contacts 12 may be solder balls, conductive pillars, etc.

In other embodiments, the second electronic component 11 may be stacked to the semiconductor package 100 in a "face-up" orientation, and electrically connected to the first conductive contacts 130 via a plurality of conductive bond wires (not shown).

Due to the film 150 being disposed on the first electronic component 120 to increase the strength the interface between the first electronic component 120 and the package body 140, even if the second electronic component 11 is removed from the semiconductor package 100 by heating, the first electronic component 120 and/or the package body 140 is not easy to crack or damage.

FIGS. 4A to 4G illustrate manufacturing processes of the semiconductor package 100 of FIG. 1.

Referring to FIG. 4A, a wafer 120' is provided, wherein the wafer 120' has at least one circuit (not illustrated). Then, the upper surface 120u of the wafer 120' may be grinded for enhancing die strength.

Referring to FIG. 4B, the film 150 is adhered to the wafer 120' and the conductive contacts 121s are disposed on the wafer 120'. In an embodiment, the film 150 is adhered to the wafer 120' first, and then the conductive contacts 121s are disposed on the wafer 120'. In another embodiment, the conductive contacts 121s are disposed on the wafer 120' first, and then the film 150 is adhered to the wafer 120'. In addition, the film 150 may be heated to be solidified.

Referring to FIG. 4C, at least one singulation path P1 passing through the wafer 120' and the film 150 to form at least one first electronic component 120 on which the film 150 is disposed. The singulation path P1 may be formed by using, for example, laser or saw, etc.

Figure 4D:
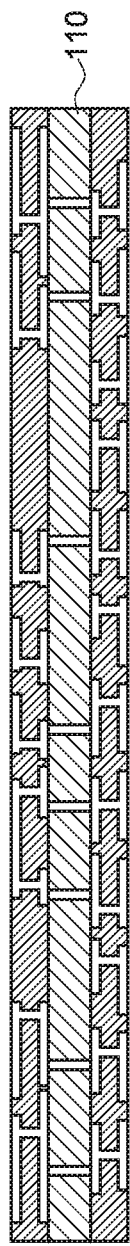

Referring to FIG. 4D, the substrate 110 is provided. The substrate 110 is, for example, a multi-layered structure or single-layered structure. The substrate 110 may be an organic substrate, a ceramic substrate, a silicon substrate, a metal substrate, etc. In another embodiment, the substrate 110 may be an interposer or a wafer having at least one redistribution layer (RDL).

Figure 4E:
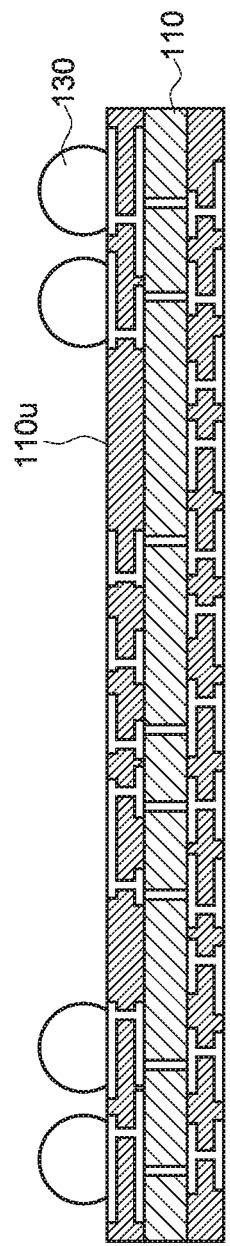

Referring to FIG. 4E, the first conductive contacts 130 are formed on the upper surface 110u of the substrate 110 by using, for example, SMT (surface-mount technology).

Figure 4F:
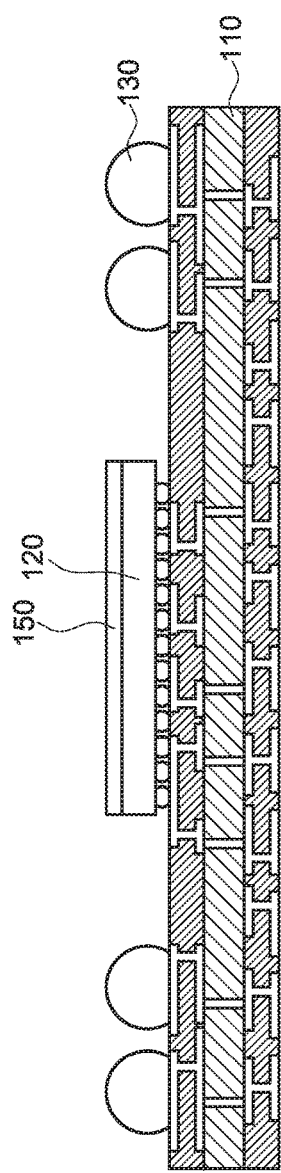

Referring to FIG. 4F, the first electronic component 120 with the film 150 is disposed on the substrate 110, wherein the first conductive contacts 130 surround the first electronic component 120.

Figure 4G:
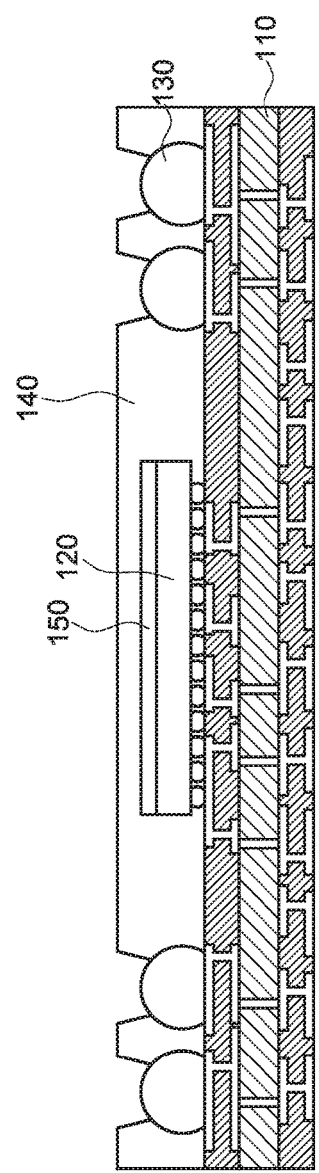

Referring to FIG. 4G, the package body 140 encapsulating the first electronic component 120, the film 150 and a portion of the each first conductive contact 130 is formed, wherein another portion of each first conductive contact 130 is exposed from the package body 140. The package body 140 may be formed by various packaging technologies, such as, for example, compression molding, injection molding, transfer molding or dispensing technology.

Then, the second conductive contacts 135 of FIG. 1 are formed on the lower surface 110b of the substrate 110 using, for example, ball mounting technology, to form the semiconductor package 100 of FIG. 1.

In another embodiment, the forming of the first conductive contacts 130 may be omitted to from the semiconductor package 200 of FIG. 2.

In addition, the second electronic component 11 of FIG. 3 may be disposed above the package body 140 of FIG. 1 by using SMT to form the semiconductor device 10 of FIG. 3.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor package, comprising:
   a substrate;
   a first electronic component disposed on the substrate and having an upper surface;
   a film disposed on the upper surface of the first electronic component; and
   a package body encapsulating the first electronic component and the film;
   wherein the film is an adhesive that covers and is in contact with an entirety of the upper surface of the first electronic component, and the package body further comprises a covering portion entirely covering and in contact with an upper surface of the film.

2. The semiconductor package as claimed in claim 1, wherein the film is directly adhered to the upper surface of the first electronic component.

3. The semiconductor package as claimed in claim 1, wherein the film has a first thickness less than a second thickness of the covering portion.

4. The semiconductor package as claimed in claim 1, further comprising:
   a plurality of conductive components disposed on the substrate and surrounding the first electronic component;
   wherein a portion of each conductive component is encapsulated by the package body and another portion of each conductive component is exposed from the package body.

5. A semiconductor device, comprising:
   a semiconductor package as claimed in claim 1; and
   a second electronic component stacked to the semiconductor package.

6. The semiconductor device as claimed in claim 5, wherein the film is directly adhered to the upper surface of the first electronic component.

7. The semiconductor device as claimed in claim 5, wherein the film has a first thickness less than a second thickness of the covering portion.

8. The semiconductor device as claimed in claim 5, wherein the semiconductor package further comprises:
   a plurality of conductive components disposed on the substrate and surrounding the first electronic component;
   wherein a portion of each conductive component is encapsulated by the package body and another portion of each conductive component is exposed from the package body.

9. A manufacturing method of a semiconductor package, comprising:
   providing a wafer having an upper surface;
   disposing a film on an entirety of the upper surface of the wafer, wherein the film is an adhesive;
   forming a singulation path passing through the wafer and the film to form at least one first electronic component on which the film is disposed, such that the film covers and is in contact with an entirety of an upper surface of the at least one first electronic component;
   providing a substrate;
   disposing the first electronic component on the substrate; and
   forming a package body encapsulating the first electronic component, wherein the package body further comprises a covering portion entirely covering and in contact with an upper surface of the film.

10. The manufacturing method as claimed in claim 9, further comprises:
    grinding the upper surface of the wafer.

11. The manufacturing method as claimed in claim 9, further comprises:
    heating the film to solidify the film.

12. The semiconductor package as claimed in claim 1, wherein:
    the package body is a molding compound.

* * * * *